US008759969B1

(12) United States Patent
Pio

(10) Patent No.: US 8,759,969 B1
(45) Date of Patent: Jun. 24, 2014

(54) INTEGRATED CIRCUIT DICE WITH EDGE FINISHING

(75) Inventor: Federico Pio, Brugherio (IT)

(73) Assignee: Micron Technology, Inc., Boise, ID (US)

( * ) Notice: Subject to any disclaimer, the term of this patent is extended or adjusted under 35 U.S.C. 154(b) by 6 days.

(21) Appl. No.: 13/346,076

(22) Filed: Jan. 9, 2012

Related U.S. Application Data

(62) Division of application No. 12/577,602, filed on Oct. 12, 2009, now Pat. No. 8,093,090.

(51) Int. Cl.
*H01L 23/04* (2006.01)

(52) U.S. Cl.
USPC ............... 257/730; 257/E21.499; 438/113

(58) Field of Classification Search
CPC ........................................ H01L 25/00
USPC .................. 257/E21.533, E21.534
See application file for complete search history.

(56) References Cited

U.S. PATENT DOCUMENTS

| 5,830,797 A * | 11/1998 | Cleeves ...................... 438/296 |
| 8,093,090 B1 | 1/2012 | Pio et al. |
| 2004/0166620 A1 | 8/2004 | Logan et al. |
| 2008/0006931 A1 * | 1/2008 | Oliver et al. ................ 257/712 |
| 2009/0267100 A1 * | 10/2009 | Miyake et al. ................ 257/98 |

* cited by examiner

*Primary Examiner* — Cheung Lee
(74) *Attorney, Agent, or Firm* — Schwegman, Lundberg & Woessner, P.A.

(57) ABSTRACT

In various embodiments, an integrated circuit die is provided. The integrated circuit die may include a circuit on a surface of a semiconductor substrate that has a peripheral sidewall extending substantially perpendicular to and away from the surface. A first protective layer may cover the sidewall of the semiconductor substrate and peripheral edges of the circuit to provide protection from contaminant diffusion. In some embodiments, a semiconductor substrate is provided that has a plurality of dice contained thereon. Each of the dice may have an integrated circuit region and a peripheral sidewall etched into the semiconductor substrate. A first protective layer may be used to cover the peripheral sidewall of the semiconductor substrate to provide protection from contaminant diffusion. Additional apparatuses, systems, and methods are disclosed.

20 Claims, 8 Drawing Sheets

INTEGRATED CIRCUIT DICE WITH EDGE FINISHING

PRIORITY APPLICATION

This application is a divisional of U.S. application Ser. No. 12/577,602, filed Oct. 12, 2009, now U.S. Pat. No. 8,093,090 which is incorporated herein by reference in its entirety.

TECHNICAL FIELD

Embodiments of the present invention relate to the field of integrated circuits and especially of semiconductor integrated circuits. These embodiments also relate to a method to fabricate a semiconductor integrated circuit.

BACKGROUND OF THE INVENTION

Semiconductor integrated circuits (IC) are widely used in a large variety of applications. The impressive progress in technology has allowed the integration of many functions, i.e. logical, data storage, parameter and/or motion sensors, etc. Correspondingly a wide variety of semiconductor ICs are produced, such as micro-processors, volatile and non-volatile memories, micro-electro-mechanical devices, embedded products, and others.

Typically many (from a few hundred to some thousands of) IC chips are realized on a wafer, such as a silicon wafer. The improved control on processing technology has lead to a miniaturization of the elementary electronic components, so that current ICs including more than 1 billion transistors are available, the maximum number being essentially limited by the chip size on the wafer and economic considerations based on a corresponding achievable yield. However, in many other cases ICs are much smaller, so that typical chip size may range from about 1 mm$^2$ to about 2 cm$^2$ (these figures are not absolute limits).

In all cases both cost and reliability are fundamental parameters to be considered together with functionality and performance. Reliability is affected by several variables such as contaminants entering the IC device. To limit such an occurrence, a top passivation layer is usually formed on the IC chip, however the finishing at the chip's edge sidewalls is a potential source of contaminants. This problem is particularly severe in those applications in which the IC is directly assembled on a board without additional assembly or package to further protect the semiconductor chip (this often occurs when space and/or weight constraints are important, such as in mobile phone apparatuses). Overall cost is not only affected by chip area but also by wafer area not useful in the final product, such as inter-dice separation scribe lanes that, despite necessary, can be viewed as wasted wafer area; which is more important in the case of small sized IC chips.

BRIEF DESCRIPTION OF THE DRAWINGS

The features and advantages of the present invention will be made apparent by the following detailed description of some embodiments thereof, illustrated merely by way of non-limiting examples in the annexed drawings, wherein.

DETAILED DESCRIPTION OF THE INVENTION

An IC comprises a plurality of electronic components that are coupled to each other so that when in operation the desired electronic functions are performed (a circuit). The circuit typically comprises transistors, diodes, resistors, capacitors, interconnections, and/or other electronic elements.

Typically many ICs are fabricated on one side of a semiconductor wafer with each IC made in an area called a die. An example of such a wafer is a circular substrate of crystalline silicon material. The processing steps are carried out on the whole wafer (and often in batches of several wafers) at the same time. The dice are separated from each other to form separate ICs.

As it will be clear from the description of the different embodiments, the specific processing steps used to fabricate the electronic components and the circuit may vary according to the specific IC. The processing steps may comprise oxidation, doping (i.e. by ion implantation), deposition, patterning, etching, thermal treatments and the like. Different materials are used to form the electronic components and the IC, exploiting their respective properties.

For the purposes of the embodiments of the invention, the description is limited to the distinguishing steps for obtaining an IC featuring an improved edge finishing and correspondingly a better immunity to contaminant diffusion. Moreover a better exploitation of wafer area is also obtained. When possible, in the description and in the figures the same numerals are used to refer to the same objects, structures, or materials.

Trenches are formed in the wafer substrate at the periphery of each IC so that the peripheral trenches substantially define a perimeter of the ICs on the silicon wafer. As it will be described in detail in the following embodiments, dice separation is obtained just at the location of trenches after back-lapping of the silicon wafer down to a thickness less than the trench depth. The separation trenches may be filled or partially filled with a protective material to minimize possible contaminant diffusion into the IC from the sidewall at the edge of the IC.

Moreover, since it is possible to define a very narrow trench width and to tightly control its dimension and alignment, the area between adjacent dice is considerably reduced, therefore minimizing the "wasted" area on the silicon wafer (i.e. the inter-dice separation area not useful for hosting the electronic components and the circuit of the IC but necessary to separate them from one-another).

Figure 1:
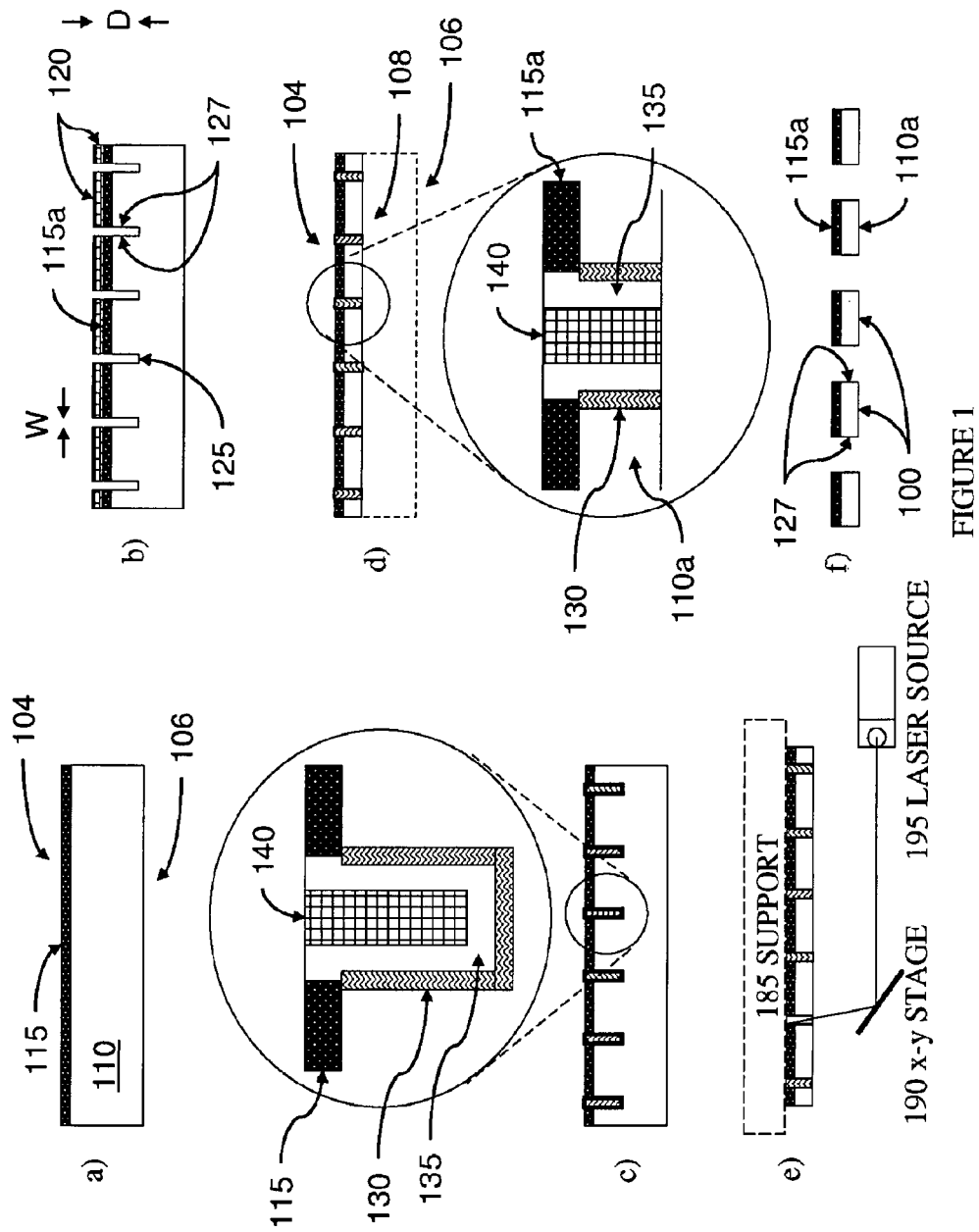
FIG. 1 illustrates a fabrication method according to one embodiment of the invention.

FIG. 1 illustrates a fabrication method of an IC 100 according to one embodiment of the invention. A semiconductor substrate 110, typically in the shape of a circular wafer, is used to host the electronic components 115 of the IC (FIG. 1a). The wafer 110 has a front-side 104 and a back-side 106. More precisely several die 100 (each one including the same electronic components) are fabricated simultaneously, i.e. following a sequence of processing steps to define the IC, on the front-side side or surface 104 of a semiconductor wafer, such as silicon wafer 110. Only relevant processing steps are described in detail in the following paragraphs, the others being IC-specific and therefore depend on which electronic components are to be fabricated.

In FIG. 1 layer 115 represents the whole of the electronic components fabricated on the entire wafer surface 104 (the same components are present in each die), including the dielectric layers placed in between and/or on top. The electronic components are realized by a plurality of patterned and/or un-patterned layers on the entire wafer 110. After dice separation the ICs 100 are obtained from the wafer 110, each one with its own substrate 110a and its own set of electronic components 115a (the latter are also referred to as the circuit 715a and 815a in subsequent FIGS. 7 and 8, respectively).

Trenches 125 are formed in the wafer substrate 110 at the periphery of each IC to be formed so that the peripheral trenches 125 substantially define a perimeter of the ICs on the silicon wafer 110 (see FIG. 1b). Correspondingly the electronic components 115 are physically subdivided into sets 115a, corresponding to the many ICs on the wafer.

The trenches' pattern is obtained by depositing a photo-resist layer 120, selectively exposing it in the desired regions, developing it, and removing it from the area where the trenches are to be formed by etching, while leaving it on regions to be protected from the etch (see FIG. 1b). In one embodiment a hard mask process is used; and the photo-resist material 120 is used to transfer the pattern to a different material (not shown in FIG. 1b) that is more resistant to the trench etch.

In one embodiment, dry etching is used. This technique allows for better control on the lateral profile of the trench. If multiple layers are present on the wafer (as may be the case if the trench formation occurs at a late stage of the fabrication process) different reactants may be used in sequence to adapt the etching step to the exposed layer. A combination of dry etching and wet etching is used in another embodiment.

The width (W) of trenches 125 is controlled by a photo-lithographic process and it is kept within a very small range, for example between 3 and 50 the minimum size being essentially limited by the aspect ratio depth/width (D/W) of the trenches to be formed. In one embodiment the trench width W is 10 μm.

The trench depth (D) is larger than the active depth of the electronic components 115. The latter depth is the depth into the silicon wafer 110 that is considered to be important for the correct functionality of electronic components 115. For example, the depth of trenches 125 is in the range 30 to 300 μm; in one embodiment it is 60 μm. It is important that the separation trench depth is larger than the final wafer thickness after back-lapping to enable dice separation (see below for the detailed description).

Adjacent dice (not yet separated from each other but with already independent circuits 115a) are divided by a inter-dice separation trench 125 of width. Separation trenches 125 define sidewalls 127, each one associated with respective die at its periphery.

A protective layer 130 is formed on the sidewalls 127 (FIG. 1c) so that a uniform layer is exposed at the edge of each IC 100 after dice separation. This feature is a considerable advantage with respect to conventional dice separation techniques that results in a plurality of materials being exposed on the sidewall of the IC. As such a configuration has weak points at the interfaces between different layers used to fabricate the circuit (i.e. the electronic components) because contaminants may effectively migrate along such interfaces. For example, contaminants may diffuse into the IC chip at the silicon/silicon dioxide interface, or at the interface between superimposed inter-metal dielectric layers, or the like. On the contrary, with the present solution the protective layer is a uniform layer without exposed interfaces.

In one embodiment, the protective layer 130 is formed by thermal oxidation of silicon in the substrate 110. Thermal silicon oxide is a high quality layer and is an effective material to prevent contaminant diffusion. Thermal oxidation of silicon is especially suited for trench sidewall 127 protection if the trench 125 is formed at an early stage of the manufacturing process. In this case the high temperature treatment necessary to oxidize silicon does not affect other structures or materials because they have not been formed at this stage. Alternatively layer 130 is deposited, for example by Chemical Vapor Deposition. This is better suited if the trench 125 formation is carried out at a later stage of the manufacturing process. Layer 130 comprises a dielectric layer. In one embodiment, the dielectric layer comprises silicon nitride. During the formation of protective layer 130 on sidewalls 127, the bottom of trenches 125 are also covered by layer 130, however this portion of the wafer will be removed at a later time.

An additional layer 135 of a different material, i.e. silicon nitride, is formed in one embodiment on top of protection layers (see FIG. 1c). A dual- or multi-layer configuration results in even better immunity to contaminant diffusion because the different materials have different diffusion coefficients for different contaminant species.

In the example depicted in FIG. 1, the trenches 125 are completely full with filling material 140. The filling material 140 is deposited on the whole wafer surface 104 and it is etched back, for example by chemical etch or by Chemical Mechanical Polishing. The filling material 140 is therefore removed from the surface 104, while it remains into the trenches 125. In one embodiment the filling material 140 is a metal or a metallic compound. The filling material may include for example tungsten, titanium, cobalt, aluminum, copper, their alloys, or other conducting material.

The choice of the filling material depends at least in part on other process steps possibly necessary for the manufacturing of the IC. For example Through Silicon Vias (TSV) are sometime used in ICs. TSVs are electrical contacts extending through the entire thickness of the IC and multiple ICs are piled on top of each other to obtain a more compact package. If Through Silicon Vias are formed (in the circuit portion of each chip—not shown in FIG. 1) during the manufacturing process, the same process steps and process materials are also used to form the separation trenches 125 at the periphery of the dice in order to achieve process optimization and overall cost reduction—for this purpose a simple mask pattern modification will be necessary to simultaneously open the inter-dice separation trenches 125 in the scribe lane and the TSV trenches in the circuit.

The substrate 110 is back-lapped to a thickness less than the depth D of trenches 125 (FIG. 1d), so that the bottom portion of the trenches 125 is also removed and the periphery of each die is defined by the separation trench for all the ICs thickness. The substrate's back-side surface 106 is moved from its original position closer to front-side surface 104 at new back-side surface 108. For example the final thickness of the wafer is in the range 25 to 270 μm (when the original trench depth is in the range 30 to 300 μm and final thickness of the wafer<original trench depth). In one embodiment, it is 50 μm (when the original trench depth is 60 μm).

As shown in the inset of FIG. 1d, the silicon wafer is now divided into a plurality of IC substrates 110a with corresponding circuits 115a, separated from each other by trenches 125 full with layers 130, 135 and 140. Note that not all the layers shown in FIG. 1d are necessary present. Furthermore, other additional layers not shown in FIG. 1d may be present, such as a barrier layer surrounding the metallic layer or a sealing/passivation layer also deposited on top of the surface 104, or other layers formed after trench filling and etch back.

To separate the dice from each other, the silicon wafer is mounted on a support 185, such as an adhesive foil, for keeping the ICs in place after physical separation. In the embodiment depicted in FIG. 1e a laser source 195 is used for dice separation. The focused laser beam is directed to and scanned on the separation regions (i.e. at the separation trenches 125), i.e. by a x-y stage 190. The filling material is cut or evaporated and the dice separate form each other, as illustrated in FIG. 1f (the die 100 are removed from support 185 and assembled in the package, if necessary). However, different separation techniques may be used; for example in one embodiment a selective etch of the filling material 140 removes it from the central portion of the trench 125 portions at the periphery of the dice, therefore separating adjacent ICs 100 from each other.

The photo lithographically-defined inter-die spacing is considerably reduced with respect to the conventional techniques. In the typical approach dice separation is carried out by a sawing process. In view of the wafer cut, both the space for the cut width and for the mechanical alignment of the cutting tool with respect to the dice must be allowed for. With the photolithographic process no space is necessary for the tool; moreover the process is intrinsically more precise, both in terms of dimension control and alignment tolerances.

To quantify the cost saving in terms of silicon wafer area it is noted that each IC effectively needs the area for the circuit and the surrounding area defining its perimeter (the scribe lane where the saw cuts the wafer, or where the trenches 125 are formed—one scribe lane is shared by two adjacent dice, but each die has two opposite sides, so that one scribe lane area must be added to each IC in each direction). Considering an active chip size of 1.5×1.5 mm$^2$ the effective area on wafer is reduced from approximately 1.6×1.6 mm$^2$ (considering a typical scribe lane of 100 μm for the saw-cut process) to about 1.51×1.51 mm$^2$, (considering a typical scribe lane of 10 μm for the separation trench process), or about 11%. Therefore the "wasted" area on the silicon wafer may be minimized. The improvement may be even better, at its edge some otherwise specially designed dummy structures in the peripheral region of the IC and the so called chip-outline-band may be avoided.

It is noted that the processing sequence described above may vary, especially with regard to the moment during the manufacturing process when the step of etching trenches in the wafer is carried out. More precisely the trenches may be formed before the structures of the electronic components are defined, when they have only partially been defined, or even after they have been completely defined. Clearly the choice depends on the optimum manufacturing sequence for the specific IC, and minor modifications to the teaching described above may be necessary without departing from the scope of the invention.

Figure 2:
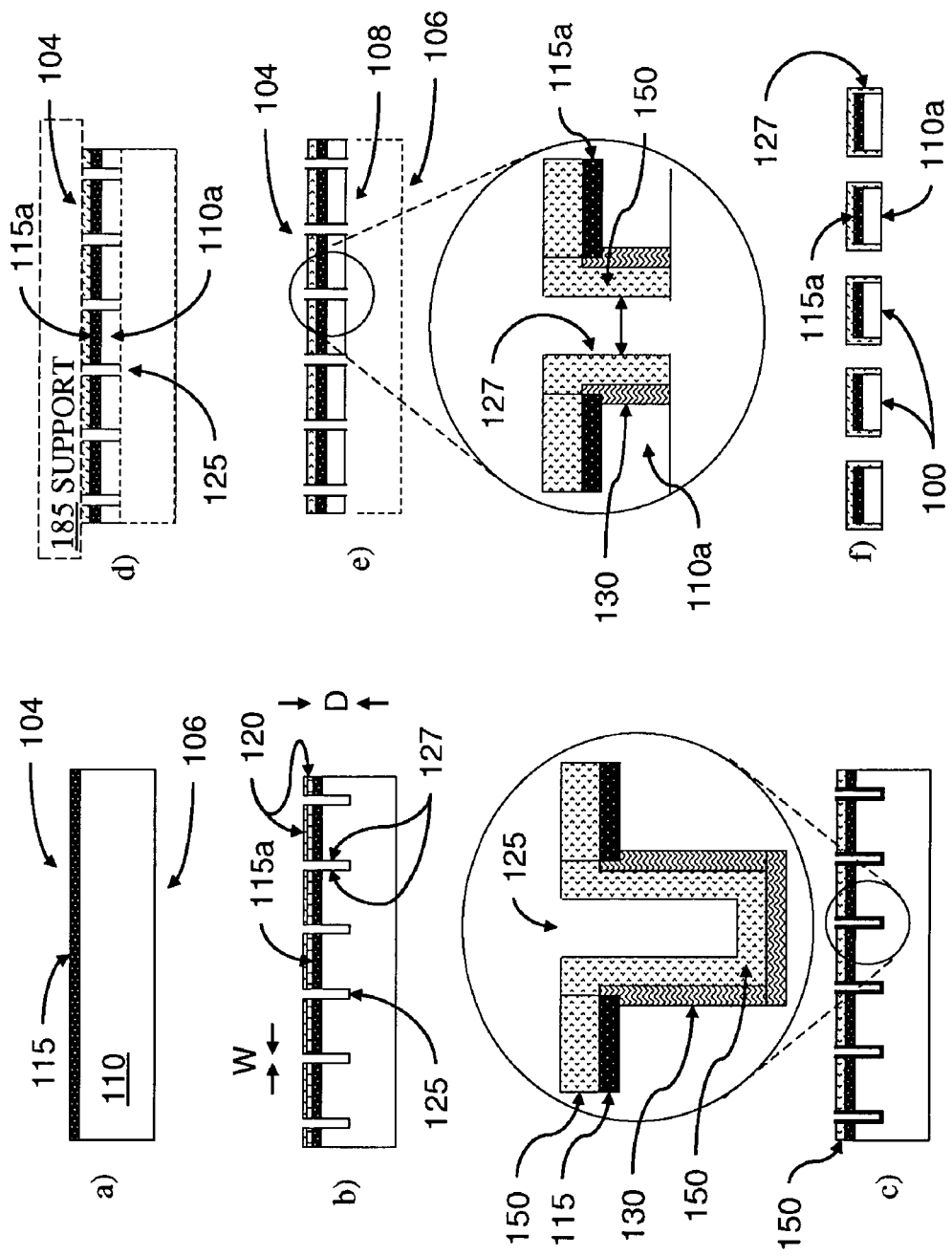
FIG. 2 illustrates a fabrication method according to another embodiment of the invention.

FIG. 2 illustrates a fabrication method according to another embodiment of the invention. On a front side 104 of a substrate 110, such as a substantially circular silicon wafer, circuits 115 are formed (see FIG. 2a). Numeral 115 in FIG. 2 generally refers to all the electronic components in the IC as already described with reference to the embodiments in FIG. 1. The specific processing steps to form electronic components 115 may vary with the kind of IC to be fabricated, and will not be discussed here.

As depicted in FIG. 2b, trenches 125 of depth D are formed in the silicon wafer 110 at the periphery of IC chips, therefore defining their perimeter. Trenches 125 involve any layer possibly present in circuit 115 at the time of the trench formation. Since the trenches 125 define the chip's perimeter, a minimum acceptable distance is present between any active structure of circuit 115 and trench 125 to avoid the risk of destroying or damaging the circuits during trench etch.

A photo-resist material 120 is exposed through a photomask, developed and selectively etched according to a photolithographic patterning technique. A hard mask formation to define the trench position and width W on silicon wafer 110 is possibly used. Electronic components 115 are therefore separated from each other into a plurality of circuits 115a, each one in a distinct IC chip (all project from the same silicon wafer 110 and therefore not mechanically independent, yet).

Trench depth D is in the range 25 to 250 μm. It is important that the depth D is larger than the final wafer thickness after back-lapping to enable dice separation (see below for the detailed description). In one embodiment, the depth D is 110 μm. Trench width W is in the range 4 to 60 μm, the minimum size being essentially limited by the capability of etching trenches with high aspect ratio (D/W). In one embodiment, the trench width W is 14 μm.

A sealing or passivation layer 150 is formed on the wafer surface, to protect the circuits 115a from possible contaminant diffusion into the chip. The passivation layer is also deposited in the trenches 125, and especially on its sidewalls 127—it is also deposited on the bottom of the trench, but this is less relevant because this portion will be later removed. In one embodiment the passivation material only partially fills the trench 125, i.e. the deposited thickness is less than half the trench width W, so that a void is present in the central portion of trenches 125, as shown in the inset of FIG. 2c.

The passivation layer 150 includes a material with good contaminant diffusion blocking properties. For example, a doped silicon oxide glass, a nitride layer, or both may be used. Openings (not shown) are formed in the passivation layer 150 at positions where pads are present for wire-bonding and/or electrical contact to the IC.

Optionally, before deposition of passivation layer 150, a further protective layer 130 may be formed on the sidewalls 127 of trenches 125. The further protective layer 130 includes silicon dioxide (either deposited or thermally grown). In one embodiment, additional protective layers are formed to obtain a multi-layer protective barrier, for example also including silicon nitride.

The front-side 104 of silicon wafer 110 is fixed to a support 185 (see FIG. 2d) and the silicon wafer 110 is back-lapped to a final thickness less than the depth D of trenches 125. During this operation the IC chips (each including semiconductor substrate 110a and circuit 115a) are mechanically separated from each other along the peripheral trenches 125 that are empty in their central portion. The final thickness of the wafer is in the range 20 to 230 μm (when the original trench depth is in the range 25 to 250 μm and final thickness of the wafer<original trench depth). In one embodiment it is 100 μm (when the original trench depth is 110 μm).

ICs obtained according to the edge finishing description above have a uniform protective layer (or a uniform multi-layer structure) to seal the sidewalls 127 and protect the IC from possible contaminant diffusion into the chip; therefore improving device reliability.

Wafer area is also saved and production cost reduced with respect to a conventional saw-cutting separation approach because there is no need to allow for cutting tool space. Moreover, the photolithographic alignment and dimensional control in separation trench definition are much higher than even the most sophisticated mechanical techniques. As such a reduced die-to-die space is possible and a corresponding higher number of dice may be placed on the same silicon wafer.

It is noted that the separation trench technique may also be applied at very late stages of the manufacturing process, so that the space in the scribe lane is available to host all those structures useful during the processing (such as photolithographic alignment marks, thickness and/or dimensional control structures, or the like). Structures for electrical parameter testing may also be included in the separation trench scribe lane space, although such a space is reduced with respect to previous scribe lanes. According to one embodiment (not depicted in a figure), the parametric testing structures are formed during the manufacturing process simultaneously with the circuit portions 115 (715 and 815 in FIGS. 7 and 8); the wafer is then tested to evaluate the parametric compliance with pre-defined targets. If the tested wafer is in line with desired results, the inter-dice separation trenches are formed and during this step the structures present in the etched regions are removed. Finally, the wafer is back-lapped to a final thickness less than the separation trench depth and the dice are separated from each other.

Regardless which of the embodiments described above is utilized, the chip edge finishing is achieved by a chemical process and therefore it is very uniform (much more than using a saw-cutting technique). The separation trench technique also has lower defectivity and higher yield. Moreover, the embodiments of the invention have the further advantage of avoiding any scratch on the lateral sidewalls 127 whereas the conventional cutting approach, on the contrary, inevitably produces a mechanical damage of the sidewalls that is a further potential cause of enhanced contaminant diffusion, as scratches may act as impurity getters and preferential diffusion paths.

One further advantage of the proposed solutions is that the tensile or compressive stress present on wafer (due to the different materials and layers used in the manufacturing process) is reduced by the trench network at the periphery of the dice when the wafer thickness is reduced. The material in the trench contributes to stress relaxation and the maximum contiguous silicon area is that of a single die or IC (i.e. about 1 to 10 mm in one direction, to be compared to 200 or 300 mm wafer's diameter), so that wafer warping and bending is minimized.

Figure 3:
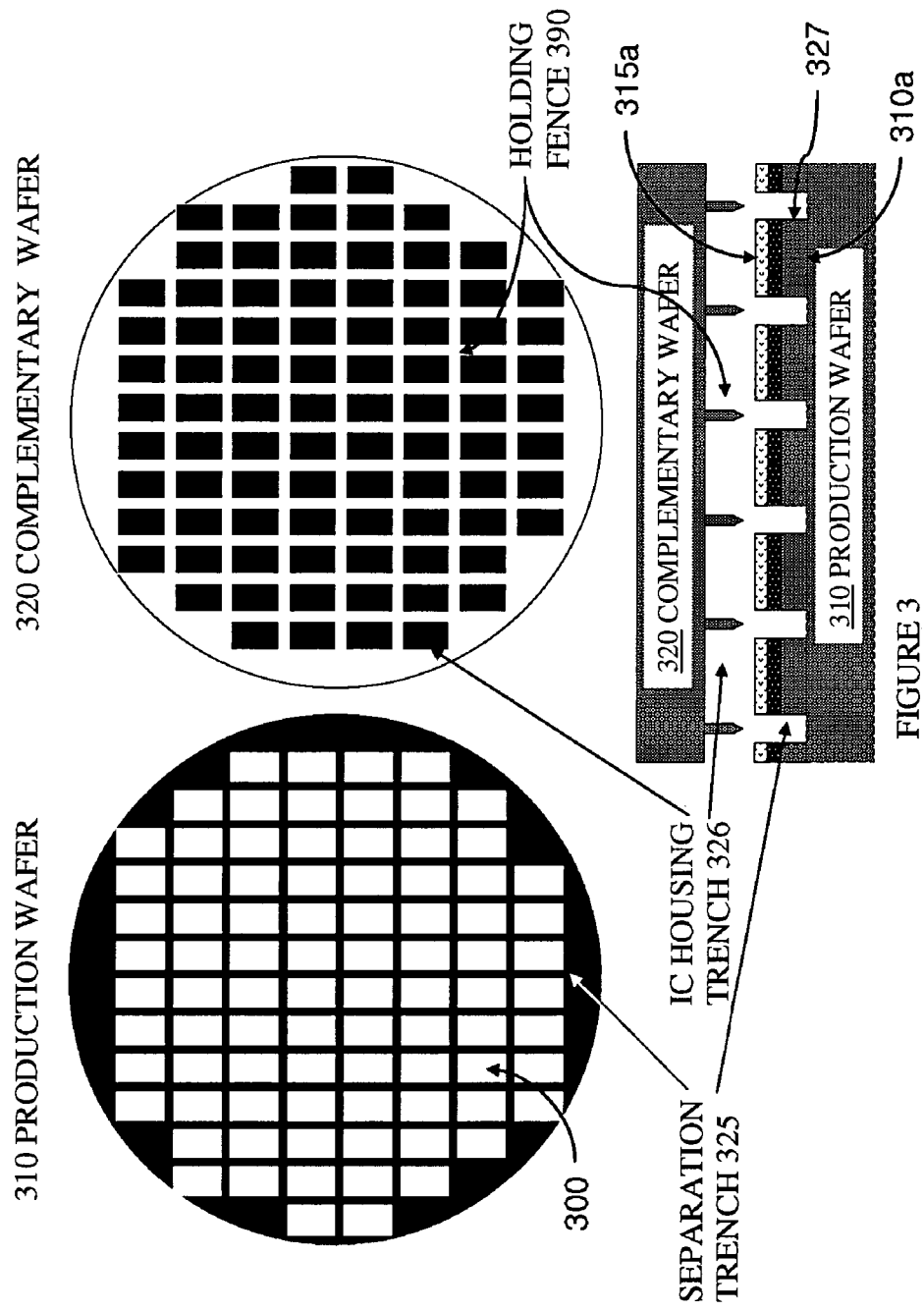
FIG. 3 illustrates a detail of a separation step in a fabrication method according to an embodiment of the invention.

FIG. 3 illustrates a detail of a separation step in a fabrication method according to an embodiment of the invention. Both a top view and the corresponding cross section of a wafer are shown. A production wafer 310 comprises a plurality of ICs 300. Each IC 300 includes a substrate portion 310a and a circuit portion 315a and has external sidewalls 327 at the periphery. The manufacturing process includes all processing steps necessary to fabricate the electronic components in circuits 315a and the specific steps to separate the ICs from each other. More specifically the dice 300 on the production wafer 310 are spaced one from another by separation trenches 325 that are formed, for example, according to one of the embodiments described above, so that the sidewalls 327 are sealed by a protective layer to minimize contaminant diffusion into the chip.

A complementary wafer 320 is fabricated comprising a pattern of IC housing trenches 326 and holding fences 390 at the periphery of each IC housing trench 326. The pattern is complementary to that of the production wafer 310, so that the holding fences 390 in the complementary wafer 320 match the separation trenches 325 in the production wafer 310 and the IC housing trenches 326 in the complementary wafer 320 perfectly match the ICs 300 in the production wafer 310. The depth of IC housing trenches 326 is less than total extension of separation trenches 325 from production wafer' surface on front-side, so that after back-lapping it is possible to grasp the ICs 300, as better described below.

The complementary wafer 320 is used as mechanical support to host the production wafer 310 during the back-lapping step. The production wafer 310 is coupled to the complementary wafer 320 so that the ICs extensions are housed in the IC housing trenches in the complementary wafer 320, while holding fences 390 are plugged into the separation trenches 325 in the production wafer 310. To facilitate coupling of production wafer to complementary wafer, holding fences 390 have a sharp termination, as depicted in the cross section in FIG. 3. In one embodiment the holding fences 390 in the complementary wafer 320 are protected by a protective layer (not shown in FIG. 3). The protective layer may be chosen so as to produce in the complementary wafer a tensile or compressive stress opposite to the one present in the production wafer at the end of processing. Once back-lapping of production wafer to final thickness the ICs 300 are removed from the IC housing trenches 326 and assembled in the package.

Figure 4:
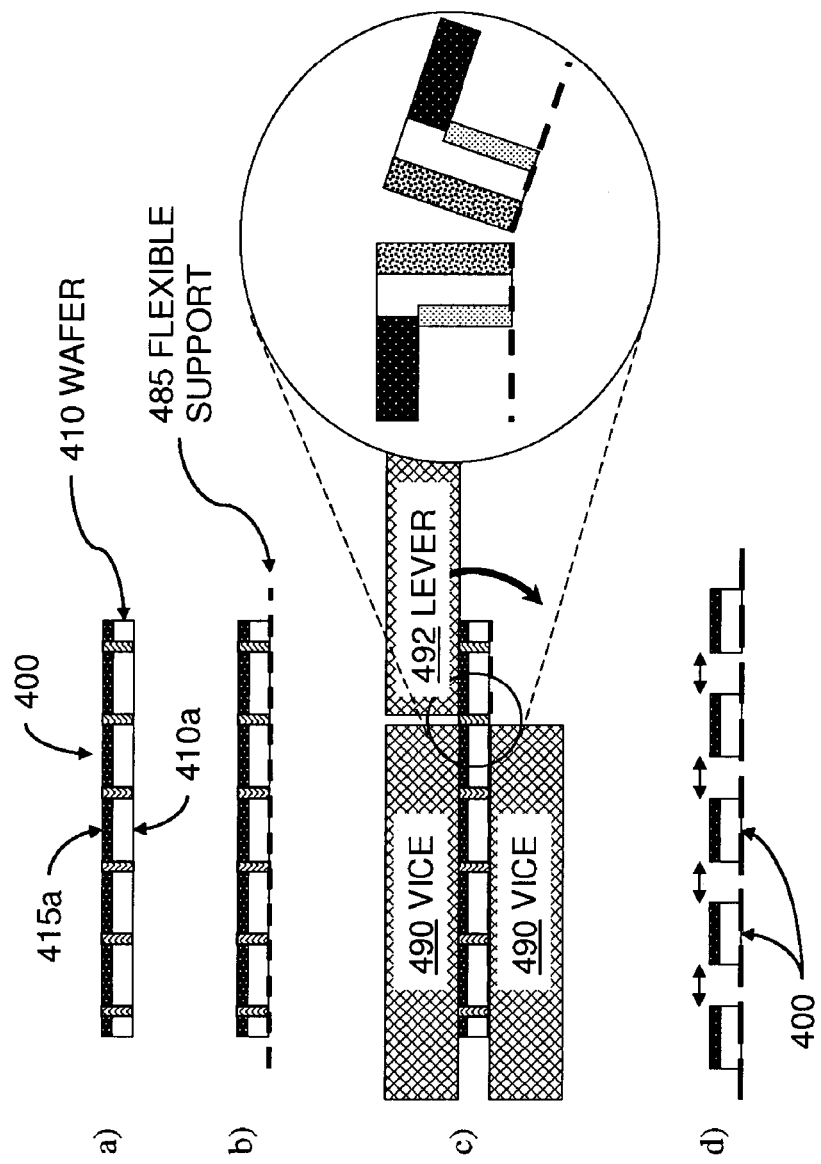
FIG. 4 illustrates a detail of a separation step in a fabrication method according to another embodiment of the invention.

FIG. 4 illustrates a detail of a separation step in a fabrication method according to another embodiment of the invention. The wafer 410 comprises a plurality of ICs 400 (see FIG. 4a). Each IC 400 includes a substrate portion 410a and a circuit portion 415a and has external sidewalls at the periphery. The manufacturing process includes all processing steps necessary to fabricate the electronic components in circuits 415a and the specific steps to separate the ICs from each other. More specifically the dice 400 on the production wafer 410 are spaced one from another by separation trenches that are formed, for example, according to one of the embodiments described above, so that the sidewalls are sealed by a protective layer to minimize contaminant diffusion into the chip.

The wafer 410 is mounted on a flexible support 485, i.e. an adhesive foil. FIG. 4b shows the mounting on the back-side of the wafer, which is the preferred embodiment in case the separation trenches are not completely full, however the mounting on the flexible support 485 may also be done on the frontside of wafer 410.

The wafer 410 is then clamped in a vice 490 up-to an inter-dice separation trench line (FIG. 4c), leaving a portion of the wafer unclamped. A lever 492 exercises a force on the unclamped portion of wafer 410 leading to mechanical separation of substrate portions 410a along the inter-dice separation trench line. This step is repeated for all inter-dice separation trench lines in both directions, so that all ICs 400 on wafer 410 are mechanically separated from each other. The flexible support 485 is elongated (FIG. 4d) and the chips are removed from it for assembling in the final package.

While FIG. 4 represents an embodiment in which the wafer has been back-lapped, in other embodiments the mechanical separation of ICs is carried out without the back-lapping step, so that adjacent dice are separated by trenches only for a portion of the wafer thickness and the protective sealing layer on sidewalls at ICs edge extends all the way to the separation trench depth (leaving the deepmost portion of the substrate unprotected).

Figure 5:
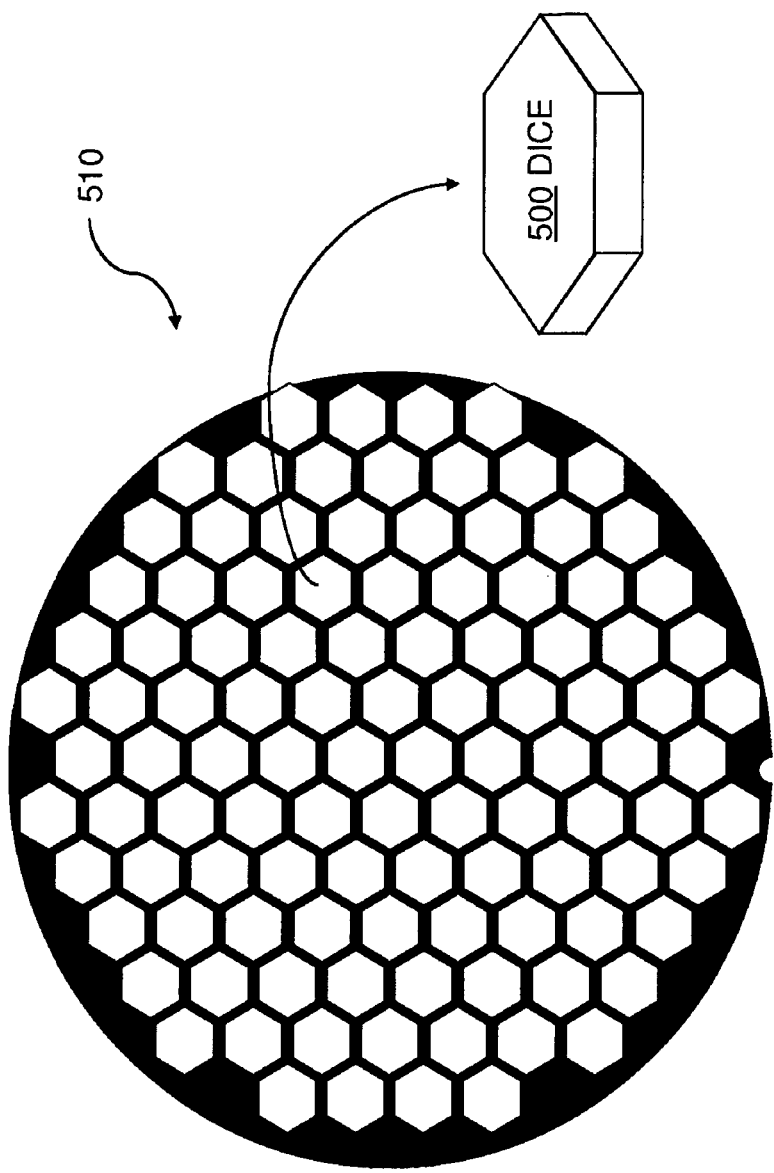
FIG. 5 illustrates a non-rectangular IC obtained from a wafer according to one embodiment of the invention.

It is noted that, while the use of saw-cutting technology limits the shape of any device to a rectangular one, with the proposed perimetric separation trench solution it is possible to produce devices of any shape. FIG. 5 illustrates a non-rectangular ICs 500, more precisely hexagonal ICs in the example depicted, obtained from a wafer 510 according to one embodiment of the invention. While FIG. 5 depicts a regular pattern with complete silicon area coverage on the wafer surface, any desired shape is obtained by appropriate layout and patterning of the IC 500 on wafer 510, including shapes that do not completely cover the surface (in this case the separation trench width is not constant on the wafer).

Such non-rectangular shapes are of interest in some cases because the maximum distance within the device is reduced. Moreover an improved area exploitation may be obtained, for example with an hexagonal shape may improve area usage at border silicon wafer. Additionally, other constraints may benefit from non-rectangular shaped dice, for example for packaging purposes. As a further example, multi-device mask sets with chips of different shapes can be realized. More precisely, sometimes, especially during the process development phase, it is desirable to include several ICs in the same mask set to reduce costs. Typically different ICs (let's consider all of them are rectangular) have different area and shape factors, so that it is not possible to assemble all of the products on a wafer because during dice separation some IC are inevitably cut for lack of periodicity. With the embodiment discussed above, however, it is possible to mechanically separate all ICs from each other (therefore maintaining the possibility to assemble all of them) independently of their shape and form factor. In one embodiment, a region with parametric testing structures and process control structures is present on the wafer.

When implementing the non-rectangular shape embodiments, care should be paid to correctly shield the exposition field during photolithographic steps to avoid superimposition of pattern in device areas.

Figure 6:
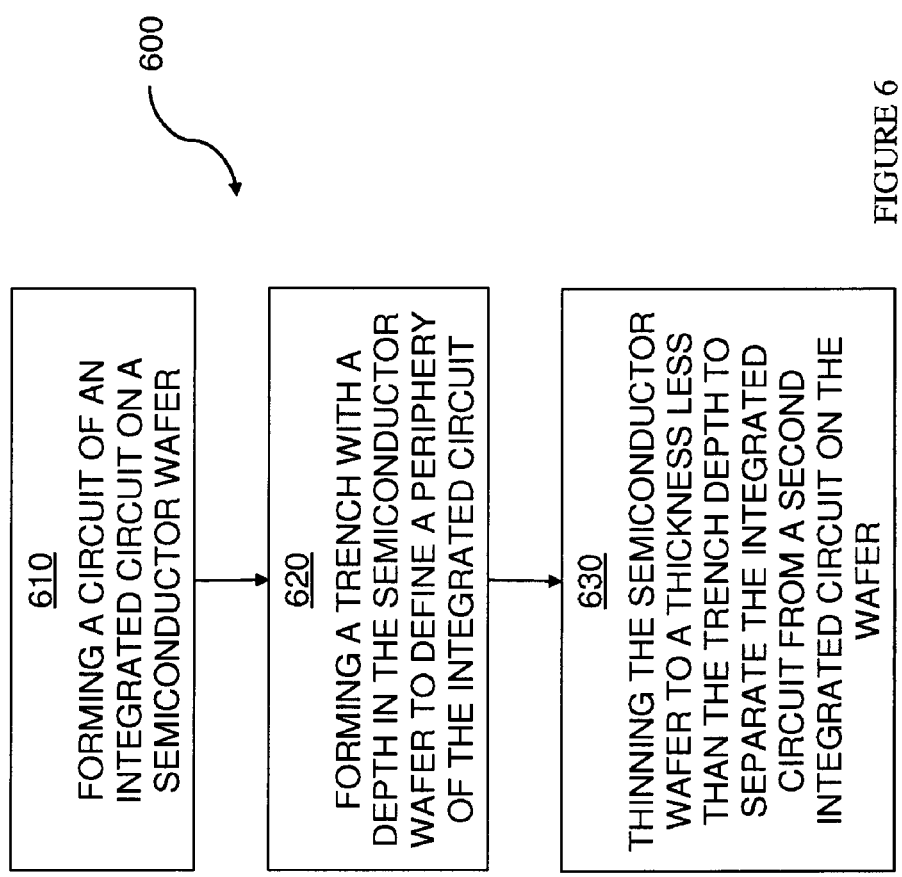
FIG. 6 illustrates a flow chart of a method according to an embodiment of the invention.

FIG. 6 illustrates a flow chart of a method according to an embodiment of the invention. A circuit of the integrated circuit is formed on one side of a semiconductor wafer at 610. A trench with a depth in the semiconductor wafer to define a periphery of the integrated circuit is formed at 620. The semiconductor wafer is thinned to a thickness less than the trench depth to separate. the integrated circuit from a second integrated circuit on the wafer at 630.

Additional method steps (not shown in FIG. 6) may include one or more of forming a protective layer on the trench sidewalls to reduce possible contaminant diffusion into the chip, forming a second protective layer onto said first protective layer to further reduce the possible contamination into the chip; depositing a sealing passivation layer onto the semiconductor wafer and into the trench, and filling the trench with a conductive material.

Figure 7:
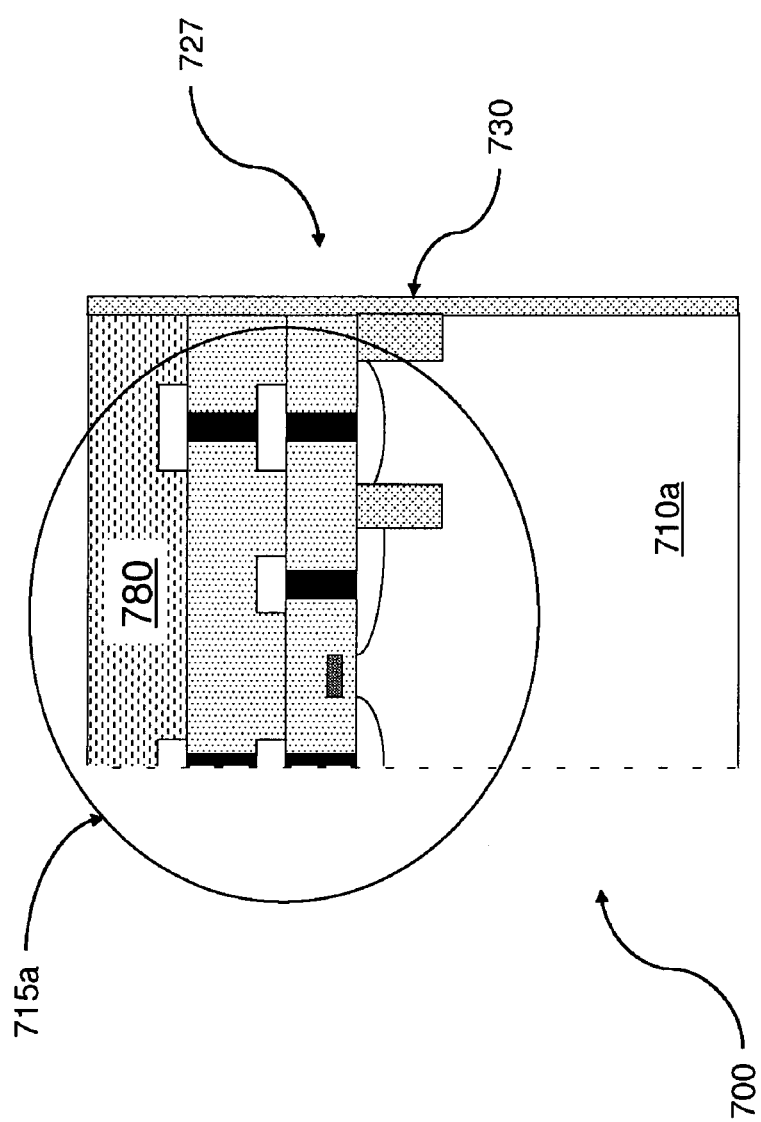
FIG. 7 illustrates an edge portion of an IC according to one embodiment of the invention.

FIG. 7 illustrates an edge portion of an IC according to one embodiment of the invention. The integrated circuit 700 includes a substrate portion 710a, typically a silicon crystal, and a circuit portion 715a. The circuit portion 715a comprises the electronic components that, coupled to each other, carry out the desired functions when the IC is in operation. The electronic components typically include transistors, diodes, resistors, capacitors, interconnections, etc. The electronic components are formed by several layers of different materials (i.e. dielectric, such as oxide, nitride, low-K dielectrics, etc., conductive materials such as polysilicon, tungsten, titanium, aluminum, copper, etc., and other material such as, ferroelectric, phase-change, magnetic materials) that are appositely shaped to obtain the desired structures (i.e. lines, gates, spacers, contacts, plates, and others). A passivation layer 780 of sealing material is present on top of the IC 700.

Chip 700 has a periphery with a sidewall 727 which is covered at least in part by a sealing protective layer 730 to limit contaminant diffusion into the device. The protective layer is substantially uniform. In one embodiment the protective layer is a dielectric layer, for example silicon dioxide. In another embodiment, the protective layer comprises the same material used as a sealing (passivation) layer 780 on top of the IC.

Figure 8:
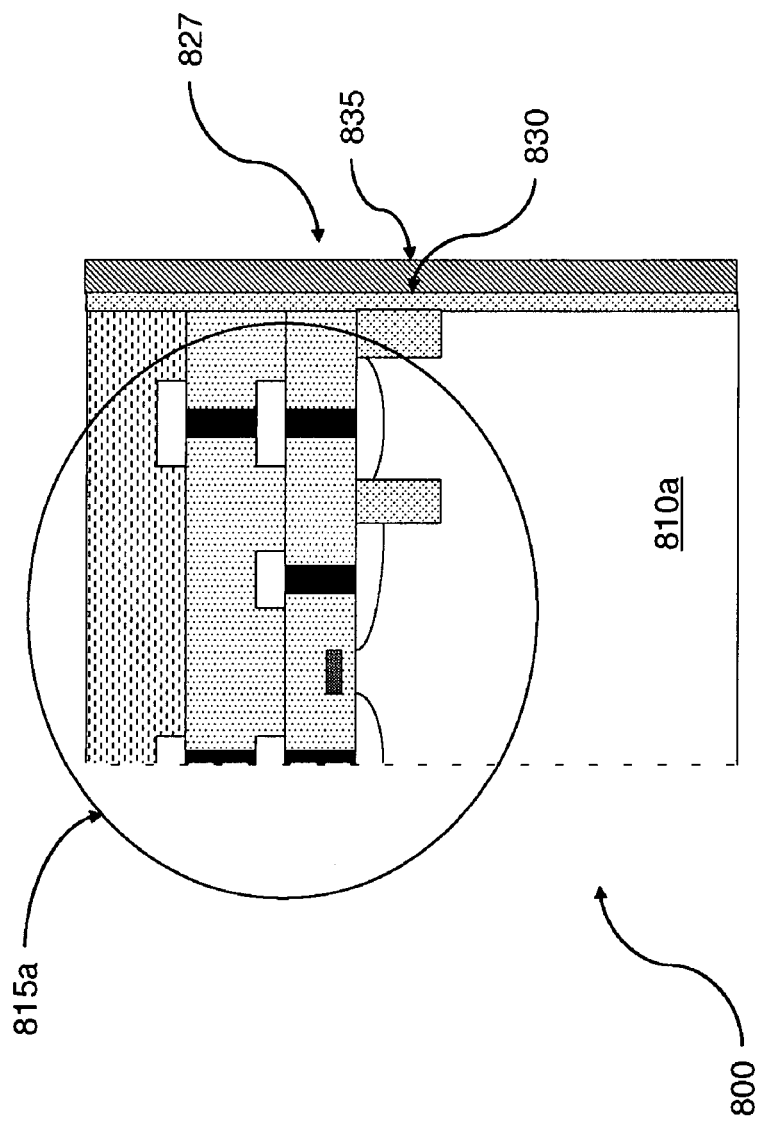
FIG. 8 illustrates an edge portion of an IC according to another embodiment of the invention.

Additional protective layer(s) overlap the first protective layer in another embodiment. For example FIG. 8 illustrates an edge portion of an IC 800 according to a different embodiment of the invention. The integrated circuit 800 includes a substrate portion 810a and a circuit portion 815a. The circuit portion 815a comprises the electronic components that, coupled to each other, carry out the desired functions when the IC is in operation, as described above.

Chip 800 has a periphery with a sidewall 827 which is covered at least in part by a sealing protective layer 830 to limit contaminant diffusion into the device. Sidewall 827 is further sealed by second protective layer 835. Protective layers 830 and 835 are substantially uniform. The second protective layer 835 comprises a layer different from the first protective layer 830, for example in one embodiment the second protective layer 835 comprises a silicon nitride layer and the first protective layer 830 comprises a silicon dioxide layer. In another embodiment the second protective layer 835 comprises a conductive material and the first protective layer comprises a dielectric material.

Many electronic systems which embed an integrated circuit according to those above described embodiments of the invention are possible. These electronic systems, such as a mobile phone, a personal computer, a joy-pad, a measurement instrument, comprise one or more electronic boards with a plurality of integrated circuits assembled on the board(s) and include Input/Output ports coupled to a micro-controller, CPU, or other processor. Depending on the application, the processor is also coupled to other integrated circuits on the same board or on other boards of the electronic system. Such integrated circuits may include, but are not limited to, a memory device (volatile or non-volatile), a micro-electromechanical device, a actuator device, a sensor, a digital-analog converter device, or other micro-controllers. Each integrated circuit has one or more circuits to perform a specific function and is on a surface of a semiconductor substrate, for example a Silicon substrate. The substrate of one in the plurality of integrated circuits has sidewalls defining the periphery of the integrated circuit (in a direction substantially perpendicular to the surface hosting the circuit). A protective layer is present on the sidewalls of the substrate to protect the integrated circuit from contaminant diffusion. The reliability of the integrated circuit(s) and of the electronic system is therefore improved.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An integrated circuit die, comprising:
   a semiconductor substrate having a front first surface and a second surface substantially parallel to the front first surface, the second surface formed entirely by back-lapping a back-side of the semiconductor substrate;
   a circuit formed on the front first surface of the semiconductor substrate, the semiconductor substrate having a peripheral sidewall extending substantially perpendicular to and between the front first surface and the back-lapped second surface, the peripheral sidewall being formed from at least one remaining surface of a trench formed around an outer periphery of the circuit and extending from the front first surface to the back-lapped second surface; and a first protective layer covering, only the peripheral sidewall of the semiconductor substrate and the outer periphery of the circuit to protect the circuit from contaminant diffusion.

2. The integrated circuit of claim 1, wherein the first protective layer comprises an oxide.

3. The integrated circuit of claim 1, further comprising a second protective layer formed over the first protective layer to further protect the integrated circuit die from contaminant diffusion.

4. The integrated circuit of claim 3, wherein the second protective layer comprises a nitride.

5. The integrated circuit of claim 3, wherein the second protective layer comprises doped silicon oxide glass.

6. The integrated circuit of claim 1, wherein the integrated circuit die has a non-rectangular shape in a plane that includes the surface of the semiconductor substrate.

7. The integrated circuit of claim 6, wherein the non-rectangular shape is substantially hexagonal.

8. The integrated circuit of claim 1, wherein a thickness of the semiconductor substrate is between about 20 μm and about 230 μm.

9. A semiconductor substrate, comprising:

the semiconductor substrate having a front first surface and a second surface substantially parallel to the front first surface, the second surface formed entirely by back-lapping a back-side of the semiconductor substrate;

a plurality of dice formed on the front first surface of the semiconductor substrate, each of the plurality of dice having a region to form an integrated circuit and a peripheral sidewall etched into the semiconductor substrate and surrounding all sides of the plurality of dice, the peripheral sidewall being formed from a trench formed around an outer periphery of each of the plurality of dice and extending from the front first surface to the back-lapped second surface; and a first protective layer formed only over each of the peripheral sidewalls formed within the semiconductor substrate to provide protection from contaminant diffusion.

10. The semiconductor substrate of claim 9, further comprising an integrated circuit formed within each region.

11. The semiconductor substrate of claim 10, wherein a distance between adjacent ones of the plurality of dice is less than a kerf-width of a cutting-tool.

12. The semiconductor substrate of claim 10, further comprising a fill material formed within a trench formed by the peripheral sidewalls of adjacent ones of the plurality of dice.

13. The semiconductor substrate of claim 12, wherein the fill material is a metal or a metallic compound.

14. The semiconductor substrate of claim 13, wherein the fill material includes at least one of the metals from a group of metals including tungsten, titanium, cobalt, aluminum, and copper, or at least one of a respective alloy of the metals.

15. The semiconductor substrate of claim 10, further comprising a second protective layer formed over the first protective layer to further protect the semiconductor substrate from contaminant diffusion.

16. The semiconductor substrate of claim 10, wherein each of the plurality of dice has a non-rectangular shape in a plane that includes the front first surface of the semiconductor substrate, the non-rectangular shape being arranged to not have a continuous straight line across the front first surface of the semiconductor substrate connecting one or more edges of one of the plurality of dice to another.

17. The semiconductor substrate of claim 16, wherein the non-rectangular shape is substantially hexagonal thereby precluding sawing of the plurality of dice by mechanical means.

18. A device, comprising:

a semiconductor substrate die having a front first surface and a second surface substantially parallel to the front first surface, the second surface formed entirely by back-lapping a back-side of the semiconductor substrate;

an integrated circuit formed on the front first surface of the semiconductor substrate die, the semiconductor substrate die having a peripheral sidewall extending substantially perpendicular to and between the front first surface and the back-lapped second surface, the peripheral sidewall being formed from at least one remaining surface of a trench formed around an outer periphery of the circuit and extending from the front first surface to the back-lapped second surface, the semiconductor substrate die further having a non-rectangular shape in a plane of the surface; and a first protective layer covering only the peripheral sidewall of the semiconductor substrate die and peripheral edges of the integrated circuit to protect the integrated circuit and the semiconductor substrate die from contaminant diffusion.

19. The device of claim 18, wherein the non-rectangular shape is substantially hexagonal.

20. The device of claim 18, further comprising a second protective layer formed over the first protective layer to further protect the integrated circuit from contaminant diffusion.

* * * * *

UNITED STATES PATENT AND TRADEMARK OFFICE
CERTIFICATE OF CORRECTION

PATENT NO. : 8,759,969 B1
APPLICATION NO. : 13/346076
DATED : June 24, 2014
INVENTOR(S) : Federico Pio It is certified that error appears in the above-identified patent and that said Letters Patent is hereby corrected as shown below:

In the Claims:

In column 11, line 4, in Claim 1, delete "covering," and insert -- covering --, therefor.

Signed and Sealed this
Nineteenth Day of August, 2014

Michelle K. Lee
*Deputy Director of the United States Patent and Trademark Office*